United States Patent [19]

Ramaprasad

[11] Patent Number: 4,695,331
[45] Date of Patent: Sep. 22, 1987

[54] HETERO-AUGMENTATION OF SEMICONDUCTOR MATERIALS

[75] Inventor: K. R. Ramaprasad, Princeton, N.J.

[73] Assignee: Chronar Corporation, Princeton, N.J.

[21] Appl. No.: 731,072

[22] Filed: May 6, 1985

[51] Int. Cl.$^4$ .......................................... H01L 21/365
[52] U.S. Cl. .................................... 437/126; 136/258;
204/157.45; 204/157.46; 423/346; 427/35;
427/39; 427/53.1; 427/54.1
[58] Field of Search ................. 427/35, 39, 53.1, 54.1,
427/55, 74, 85, 86, 87; 204/157.1 R, 164,
157.45, 157.46; 423/346; 148/1.5, 171, 174;
136/258 AM; 357/2

[56] References Cited

U.S. PATENT DOCUMENTS

| | | | |
|---|---|---|---|
| 4,385,199 | 5/1983 | Hamakawa et al. | 136/258 AM |
| 4,564,533 | 1/1986 | Yamazaki | 427/39 |
| 4,569,855 | 2/1986 | Matsuda et al. | 427/35 |
| 4,585,671 | 4/1986 | Kitagawa et al. | 427/54.1 |

FOREIGN PATENT DOCUMENTS 2148328 5/1985 United Kingdom ........ 136/258 AM

OTHER PUBLICATIONS

T. Inoue et al., *Apply. Phys. Lett.*, vol. 44, pp. 871–873 (May 1984).
T. Tanaka et al., *Appl. Phys. Lett.*, vol. 45, pp. 865–867 (Oct. 1984).

*Primary Examiner*—Aaron Weisstuch
*Attorney, Agent, or Firm*—George E. Kersey

[57] ABSTRACT

Hetero-augmentation of semiconductor materials by reacting a mixture of (1) a gaseous precursor of a host semiconductor with (2) a gaseous compound of the host and a hetero atom. The host precursor is a semiconductor hydride or a mixture of hydrides, including those of silicon and germanium. The compound of the host and hetero-atom includes a silyl or germyl dopant or alloyant. Suitable dopants are phosphorous, arsenic, and nitrogen. Suitable alloyants are other semiconductors and nitrogen. The reaction can take place pyrolytically, by electrical discharge, or photochemically.

14 Claims, 2 Drawing Figures

HETERO-AUGMENTATION OF SEMICONDUCTOR MATERIALS

BACKGROUND OF THE INVENTION

This invention relates to the augmentation or supplementation of semiconductor materials by hetero-atoms, and, more particularly to the doping or alloying of semiconductor materials by hetero-atoms.

In order to provide semiconductor materials with prescribed electrical and physical characteristics, it is common practice to add hetero-atoms to the material. For example, silicon can be used in the production of photovoltaic devices for the conversion of sunlight to electrical energy by the introduction of dopants, such as phosphorus or boron atoms to produce a layered photovoltaic cell. A typical photovoltaic cell of amorphous material includes an intrinsic layer of a semiconductor, such as silicon, which is sandwiched between respective doped layers to provide for the respective generation of holes and electrons in the presence of solar excitation. Thus, the generator of holes can be produced by the boron doping of silicon, while the generator of electrons can be produced by the phosphorus doping of silicon.

The most common technique for doping amorphous materials involves the introduction of the dopant in gaseous form into a reaction chamber with basic feed stock, which is generally a semiconductor hydride. While this procedure can produce satisfactory devices, it is necessary to carefully control the rate of deposition and the concentration of the dopant or hetero-atom.

Accordingly, it is an object of the invention to facilitate the production of semiconductor materials having prescribed characteristics.

A related object is to facilitate the production of doped and alloyed semiconductors. Still another related object is to facilitate the production of doped silicon and germanium as well as their alloys.

A further object of the invention is to achieve enhanced control over the rate at which the deposition of doped and alloyed semiconductors takes place.

A still further object of the invention is to achieve increased control over the concentration of the dopant or alloying atoms that are introduced as hetero-atoms into semiconductor materials.

SUMMARY OF THE INVENTION

In accomplishing the foregoing and related objects, the invention provides for the introduction of one or more hetero-atoms into a semiconductor by reacting the mixture of a gaseous host semiconductor precursor and a gaseous compound of the host and the hetero-atom.

The hetero-atom may be used to either dope or alloy the semiconductor depending upon the hetero-atom.

In accordance with one aspect of the invention, the reaction can take place pyrolytically, by electrical discharge, or by photo-chemical decomposition.

In accordance with another aspect of the invention, the reaction temperature is at or below the customary range for the material and the reaction pressure is nominal or below that ordinarily used for the material in question.

In accordance with yet another aspect of the invention, the compound of the host precursor and the hetero-atom is a silyl or germyl dopant or alloyant. Suitable dopants include phosphorus, arsenic, and nitrogen. Suitable alloyants include other semiconductors and nitrogen.

In accordance with another aspect of the invention, the precursor is a semiconductor hydride or a mixture of hydrides including those of silicon and germanium.

DESCRIPTION OF THE DRAWINGS

Other aspects of the invention will become apparent after considering several illustrative embodiments, taken in conjunction with the drawings in which.

DETAILED DESCRIPTION

Figure 1:
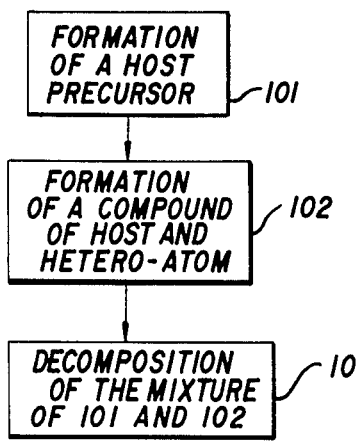
FIG. 1 is a flow chart for the practice of the invention.

With reference to the drawings, FIG. 1 sets forth a flow chart 100 for the practice of the invention.

The invention commences with a host semiconductor precursor in step 101, that is to be fed to a reaction chamber. Typical precursors include silicon and germanium hydrides, but other precursors may be employed as well.

In addition, for doping, it is necessary to provide, in step 102, a compound of the host precursor and a hetero-atom. In the case of semiconductor precursors, the compound is represented by the general formula (1):

$$(AH_3)_{1+x}BH_{2-x} \qquad (1)$$

where:

x is 0, 1, or 2 for dopant compounds;

A is a semiconductor such as silicon or germanium; and

B is a dopant such as phosphorus or arsenic.

In the final step 103 of the process the mixture of the precursor and the dopant compound is decomposed in a reaction chamber.

For alloying, the compound is represented in one instance by the general formula (2):

$$(AH_3)_{1+x}B'H_{3-x} \qquad (2)$$

where:

x is 0, 1, or 2

A is a semiconductor; and

B' is a semiconductor or tin.

For alloying with nitrogen the formula for the compound becomes (3):

$$(AH_3)_{1+x}NH_{2-x} \qquad (3)$$

Where A, x and H are as for equation (1).

Figure 2:
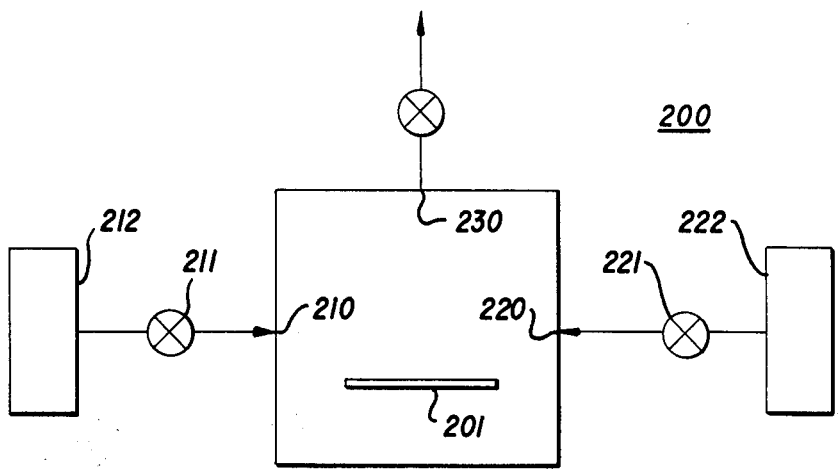
FIG. 2 is a schematic diagram of a reaction chamber and accessories for the practice of the invention.

FIG. 2 shows an illustrative reaction chamber 200 which includes a substrate 201, for example of glass, ceramic, or metal, upon which the reaction products are formed. The gaseous precursor is applied at an inlet 210 through a valve 211 from a source 212. The doping compound is applied through an inlet 220 through a valve 221 from a source 222. Reaction takes place pyrolytically (by application of heat), electrically (by, for example an electrical discharge) or photo-chemically (by the application of spectral energy) from a suitable source (not shown). The byproducts of the reaction are exhausted from the reaction chamber at an outlet 230 which is maintained at a suitable pressure.

The invention is further illustrated by the following non-limiting examples:

EXAMPLE I

The growth rate of boron-doped amorphous silicon is higher than that for phosphorus-doped silicon produced in conventional fashion. It is speculated that this results from the adverse effect of phosphine molecules on the reaction source. For example, in the case of CVD there is a "catalytic" poisoning of the film by phosphine. Similarly in the case of photo-chemical vapor deposition, the phosphine molecules are believed to absorb light to a greater extent than the predominant host silicon hydride.

The invention overcomes the foregoing difficulties by the employment of a phosphorus source compound where a silicon-phosphorus bond pre-exists. As a result the doping does not involve the decomposition of two chemically distinct compounds and the incorporation of dopant atoms into a host matrix.

Accordingly, the reaction chamber is used for the co-decomposition of a silicon hydride and a silicon hydride derivative which contains the desired dopant. Examples of such silicon hydride derivatives include silyl phosphines beginning with monosilyl phosphine ($SiH_3PH_2$) and including disilyl phosphine ($SiH_3PHSiH_3$) and trisilyl phosphine ($SiH_3PSiH_3SiH_3$). Suitable control over the silicon-phosphorus ratio is obtained by proportioning the phosphine or phosphines in relation to the feed stock of silicon hydrides, inert gases and/or hydrogen.

The result is a phosphorus doped amorphous silicon hydride in which the reaction time was significantly reduced in comparison with the prior art technique of conventional phosphorus doping.

EXAMPLE II

Example I is repeated with a germyl phosphine substituted for the silyl phosphine and germanium hydride substituted for silicon hydride. The result is a suitable phosphorus-doped germanium.

EXAMPLE III

To prepare a wide bandgap material of amorphous silicon hydride with a nitrogen bond, a silicon hydride feed stock is reacted with a silyl amine as the nitrogen source.

The silyl amines have the formula $(SiH_3)_{1+x}NH_{2-x}$ where x was 0, 1, or 2.

The result is a wide bandgap material that is produced more quickly than for the conventional reaction of silicon hydrides and ammonia.

EXAMPLE IV

In order to achieve arsenic doping of a semiconductor, the conventionally employed arsenic dopant of arsine ($AsH_3$) is replaced by silyl arsine.

Reaction conditions are the same as for arsine, but the reaction takes place in a shorter time and produces a suitable arsinically doped semiconductor.

EXAMPLE V

The foregoing examples are repeated using a mixed silicon germanium hydride as the feed stock material. The results are similar to those achieved for single hydrides as feed stock material.

EXAMPLE VI

In order to produce a tin alloy with a semiconductor, a silyl tin hydride is reacted with a silicon hydride feed stock under conventional operating conditions.

The result is a silicon tin alloy which is formed in considerably less time than is required for conventional tin alloying.

Other aspects of the invention will be apparent to those of ordinary skill in the art who will appreciate that the foregoing disclosure is illustrative only.

What is claimed is:

1. The method of forming a doped semiconductor which comprises the steps of:
   (a) feeding a gaseous host semiconductor precursor to a reaction chamber;
   (b) introducing a gaseous compound of the host and a hetero-atom into the reaction chamber, said hetero-atom being a dopant for said semiconductor; and
   (c) reacting the mixture of the precursor and the compound in said chamber.

2. The method of claim 1 wherein the reaction takes place pyrolytically.

3. The method of claim 1 wherein the reaction takes place by electrical discharge.

4. The method of claim 1 wherein the reaction takes place by photo-chemical decomposition.

5. The method of claim 1 wherein the compound is a silyl phosphine and the precursor is a silicon hydride.

6. The method of claim 5 wherein the phosphine is selected from the class of monosilyl phosphines and polysilyl phosphines including di- and trisilyl phosphines.

7. The method of claim 1 wherein the compound is a germyl phosphine and the precursor is a germane.

8. The method of claim 1 wherein the compound is a silyl amine.

9. The method of claim 8 wherein the silyl amine has the formula $(SiH_3)_{1+x}NH_{2-x}$.

10. The method of claim 1 wherein the compound is a silyl amine.

11. The method of claim 1 including producing a semiconductor alloy wherein the precursor is a mixture of semiconductor hydrides.

12. The method of claim 11 wherein the mixture is of silicon and germanium hydrides.

13. The method of claim 1 wherein said compound has the formula $(AH_3)_{1+x}BH_{2-x}$, where x is 0, 1 or 2; A is silicon or germanium; B is phosphorus, arsenic, or nitrogen.

14. The method of producing a semiconductor alloy which comprises the steps of:
   (a) feeding a gaseous compound of the type $(AH_3)_{1+x}B'H_{3-x}$ where x is 0, 1 or 2, A is silicon; and B' is an alloying element selected from germanium and tin; to a reaction chamber;
   (b) introducing a gaseous semiconductor precursor into said reaction chamber; and
   (c) reacting the mixture of said precursor and said compound in said reaction chamber;
   thereby to achieve a semiconductor alloy.

* * * * *